(12) United States Patent
Tanaka et al.

(10) Patent No.: US 6,710,610 B1
(45) Date of Patent: Mar. 23, 2004

(54) SOCKET FOR TESTING OF SEMICONDUCTOR DEVICE, AND SEMICONDUCTOR DEVICE AND METHOD OF MANUFACTURING THE SEMICONDUCTOR DEVICE

(75) Inventors: Naotaka Tanaka, Ibaraki-ken (JP); Hiroyuki Ohta, Tsuchiura (JP); Ichiro Anjoh, Koganei (JP); Hideo Arima, Yokohama (JP); Akio Hasebe, Higashimurayama (JP); Kenichi Yamamoto, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/407,838

(22) Filed: Sep. 29, 1999

(30) Foreign Application Priority Data

Sep. 29, 1998  (JP) ............................. 10-275512

(51) Int. Cl.$^7$ .............................................. G01R 31/02
(52) U.S. Cl. ....................................... 324/755; 324/765
(58) Field of Search ............................... 324/755, 754, 324/765, 761; 257/675, 704, 774, 778; 428/209, 901

(56) References Cited

U.S. PATENT DOCUMENTS

| 4,954,878 | A | * | 9/1990 | Fox et al. ................... 257/675 |
| 5,258,648 | A | * | 11/1993 | Lin ............................. 257/778 |
| 5,691,041 | A | * | 11/1997 | Frankeny et al. ............ 428/209 |
| 5,952,840 | A | * | 9/1999 | Farnworth et al. .......... 324/755 |
| 6,246,249 | B1 | * | 6/2001 | Fukasawa et al. .......... 324/765 |
| 6,249,135 | B1 | * | 6/2001 | Maruyama et al. ......... 324/765 |

FOREIGN PATENT DOCUMENTS

| JP | 06-349557 | 12/1994 |
| JP | A-10-32070 | 2/1998 |
| JP | A-10-79281 | 3/1998 |
| JP | 10-150130 | 6/1998 |

* cited by examiner

*Primary Examiner*—Kamand Cuneo
*Assistant Examiner*—Minh N. Tang
(74) *Attorney, Agent, or Firm*—Antonelli, Terry, Stout & Kraus, LLP

(57) ABSTRACT

Electrode pads are formed on a tape circuit to correspond to positions of solder bumps on an IC. A plurality of pins formed on a periphery of the tape circuit provide electrical connection between the tape circuit and a mother socket. An elastomer sheet is provided between a portion of the tape circuit, on which the electrode pads are formed and the IC is mounted, and the mother socket, and a side surface of the sheet, which contacts with the tape circuit, is formed with cut grooves in lattice fashion such that respective centers of the electrode pads substantially coincide with intersections of the grooves. Thus portions defined by the grooves on the sheet are made independent from one another to enable accommodating pushing forces from the solder bumps, so that, even if dispersion in height generates between the solder bumps, the respective portions defined by the grooves are hardly influenced by one another, and so accommodate the pushing forces from the solder bumps to permit the solder bumps and the electrode pads to surely contact with each other.

11 Claims, 7 Drawing Sheets

CROSS SECTIONAL CONFIGURATION AND
LOAD CONDITION OF ANALYTICAL MODEL

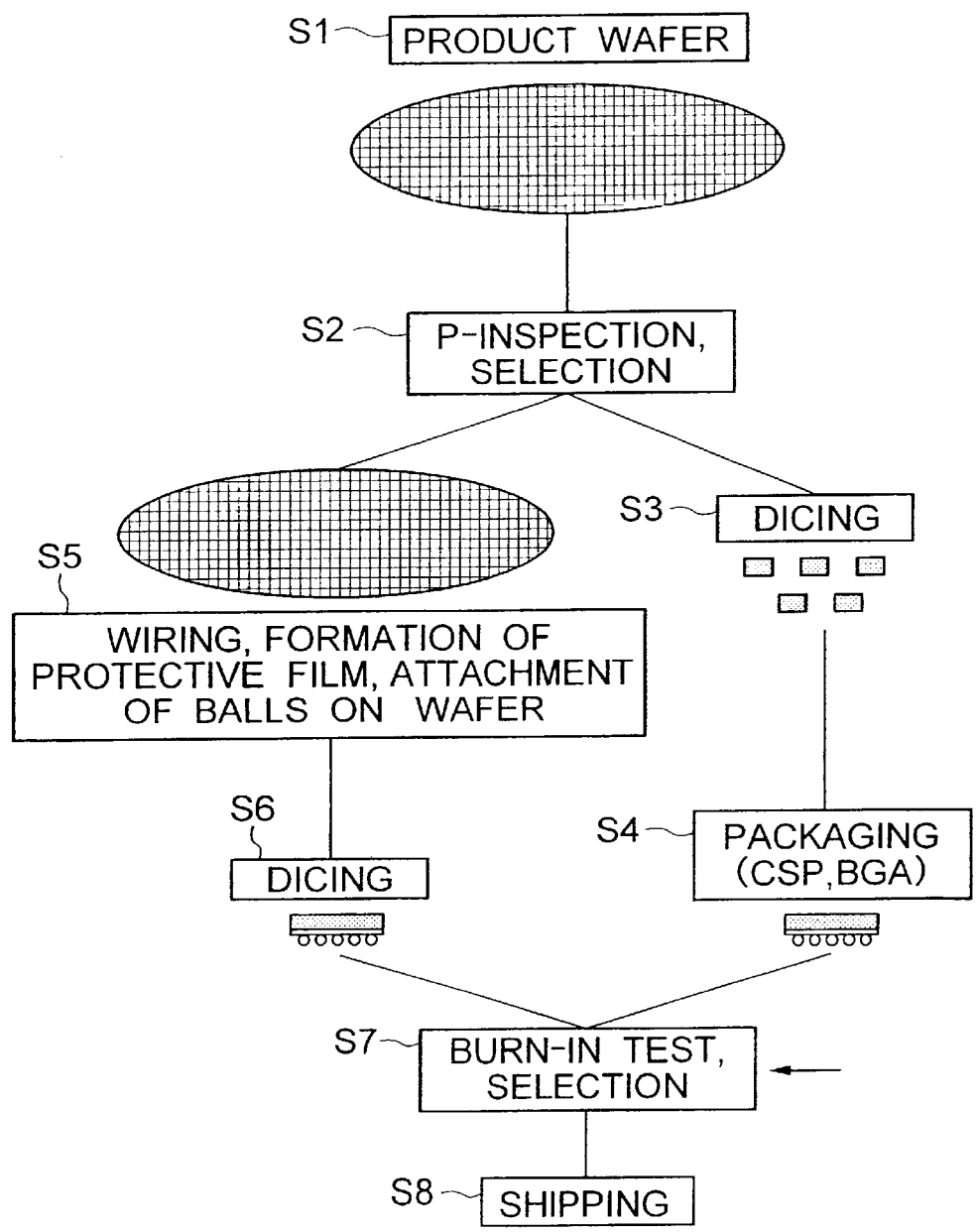

SOCKET FOR TESTING OF SEMICONDUCTOR DEVICE, AND SEMICONDUCTOR DEVICE AND METHOD OF MANUFACTURING THE SEMICONDUCTOR DEVICE

BACKGROUND OF THE INVENTION

The present invention relates to a BGA (Ball Grid Array) type semiconductor device having area array type electrodes on an underside and a periphery thereof, and more particularly, to a socket for testing of semiconductor devices, suitable for testing of semiconductor devices having a fine pitch of 0.5 mm or less between electrodes, and a semiconductor device shipped after going through the testing process.

In recent years, ICs (for example, BGA) constructed to use projection electrodes, such as solder bumps or the like, for external connection electrodes have been presented in order to attempt miniaturization of IC packages. Further, to attempt further miniaturization of IC packages, it has been demanded for semiconductor devices having the above described projection electrodes to be made high in density and in speed. With such demand, there is a tendency that a pitch between projection electrodes has become further small.

Meanwhile, the characteristic test such as the burn-in test or the like is performed on ICs manufactured with respect to whether the ICs have a predetermined characteristics. At the time of testing, the ICs are tested in a state, in which they are mounted on a socket for testing of IC.

Accordingly, it is also necessary for the socket for testing of ICs to accommodate the tendency of ICs making high in density and minute. Also, projection electrodes themselves have decreased exceedingly in strength with the tendency of ICs making high in density and minute, so that it is necessary for projection electrodes not to be damaged even if contact pins provided on the socket for testing of ICs are brought into contact with them.

To meet the need for such sockets for testing of ICs, arcuate-shaped contact pins of metal supported by a floating member made of an organic material are used in, for example, the invention described in Japanese Patent Unexamined Publication No. 09-289068.

That is, the invention described in the above described Publication provides a construction, in which arcuate-shaped portions of the contact pins serve as a stopper for the floating member to control pushing amounts of the contact pins to inhibit deformation of solder balls even if terminals of the solder balls soften in a heat test or the like.

Also, in the invention described in Japanese Patent Unexamined Publication No. 10-69955, a substrate for testing, and solder bumps on an IC are connected to each other by a plurality of metallic contact pins, which are supported by an elastic member.

The invention described in the above described Publication provides a construction, in which deformation of the solder balls is inhibited by making a diameter of such plurality of metallic contact pins possible for the contact pins to pierce the solder balls, and favorable contact is obtained by electrically connecting the contact pins to the solder balls through piercing of the contact pin ends into the solder balls.

Because the socket for testing of ICs in the above described prior art premises the use of metallic contact pins, however, further minute contact pins must be formed in order to accommodate small pitches of external electrode attributable to the small sizing of IC packages, but such measures are limited in terms of cost and technique.

Further, with the construction of a socket for testing of ICs, in which contact pins are used, since it is difficult to mount the contact pins directly on a base substrate intended for testing when arrangement of the contact pins in small pitch is attempted, it is required that wiring be once laid on an intermediate substrate and pins for connection to the base substrate be formed.

In contrast, a socket construction for testing of ICs has been conceived and realization thereof has been under review, in which construction metallic contact pins are done away with and which comprises a tape circuit 2 with electrode pads corresponding to an external electrode arrangement of an IC, and an elastomer sheet 1 provided between the tape circuit 2 and a mother socket 4, as shown in FIG. 2.

A construction of a socket circuit for testing of ICs with the use of the above described tape circuit will be generally described with reference to FIG. 2. In the construction, the tape circuit 2 having electrode pads corresponding to an external electrode arrangement of an IC 5 is provided between an IC socket body 8 and the mother socket 4, and the elastomer sheet 1 is provided between the tape circuit 2 and the mother socket 4.

The IC 5 being tested is guided by the IC socket body 8 to be inserted thereinto, and external electrodes of the IC 5 are pushed against external electrodes formed on the tape circuit 2 for testing of the IC. A socket construction using the tape circuit 2 is effective as a socket construction for testing of fine pitch type ICs in that it is relatively easy to make electrode pads small in pitch and minute, and the construction is substantially inexpensive as compared with metallic contact pins, and parts except the tape circuit are made common in various applications.

Hereupon, with the above described socket construction using metallic contact pins, positions of the respective pins can displace independently in a vertical direction when pushed by external projection electrodes (for example, solder bumps) of an IC being tested, so that dispersion in height between adjacent external projection electrodes of the IC is easy to be accommodated.

In contrast, with the socket construction using a tape circuit, an elastomer sheet is disposed on a portion of the tape circuit, on which an IC is mounted (inserted), in order to prevent a surface of the tape circuit from continuously deforming when pushed by external projection electrodes of the IC being tested.

This is directed to accommodating such dispersion in height by causing local deformation of the elastomer sheet, which is produced by pushing of the external projection electrodes on the IC, to spread over a region of electrode pads on the tape circuit, which pads are not pushed by virtue of external projection electrodes being small in height.

However, because the elastomer sheet is small in rigidity as compared with the tape circuit, deformation of the elastomer sheet caused by pushing almost spreads in a out-of-plane direction, and a region, which is not pushed by external projection electrodes, is deformed under the influence of tension of the tape circuit, with the result that little effects are obtained in accommodating dispersion in height between adjacent external projection electrodes on an IC being tested, thus offering a problem involving a difficulty in executing accurate testing of semiconductor devices.

It is an object of the invention to realize a socket for testing of semiconductor devices, which is capable of accommodating dispersion in height between adjacent external projection electrodes on an IC and accurately testing semiconductor devices, which are made minute and high in density, a method of testing semiconductor devices, a method of manufacturing semiconductor devices with the use of the testing method, and semiconductor devices manufactured by the manufacturing method.

SUMMARY OF THE INVENTION

To attain the above described object, the invention is constituted as follows:

(1) A socket for testing of semiconductor chips having a plurality of external projection electrodes arranged on an underside and a periphery of a semiconductor chip body in an area array fashion, the socket comprising a tape circuit having electrode pads formed in an area array fashion, a mother socket supporting the tape circuit, and an elastomer sheet provided between the tape circuit and the mother socket, the elastomer sheet being formed on a surface thereof with grooves.

(2) A socket for testing of semiconductor chips having a plurality of external projection electrodes arranged on an underside and a periphery of a semiconductor chip body in an area array fashion, the socket comprising a tape circuit having electrode pads formed in an area array fashion, a mother socket supporting the tape circuit, and an elastomer sheet provided between the tape circuit and the mother socket, the elastomer sheet being formed on a surface thereof with cuts.

(3) Preferably, in the socket in (1) or (2), the surface of the elastomer sheet is divided in lattice, and intersections of respective lattice lines defining the lattice are disposed in an area to face positions of the electrode pads formed on the tape circuit.

(4) Preferably, in the socket in (1) or (2), the surface of the elastomer sheet is divided in lattice, and a spacing between the respective lattice lines defining the lattice is substantially the same as a spacing between the electrode pads formed on the tape circuit.

(5) Preferably, in the socket in (1), (2), (3), or
(4), that surface of the elastomer sheet, which faces the tape circuit, is divided in lattice.

(6) Preferably, in the socket (1), (2), (3), (4), or (5), the elastomer sheet is an insulating sheet having a hardness of 50° H or more.

(7) A method of manufacturing semiconductor devices having a plurality of external projection electrodes on an underside of and a periphery of a semiconductor chip body in an area array fashion, the method comprising a burn-in testing step of using a socket for testing of semiconductor chips, which socket includes a tape circuit having electrode pads formed in an area array fashion, a mother socket supporting the tape circuit, and an elastomer sheet provided between the tape circuit and the mother socket and formed on a surface thereof with grooves, and performing testing by pushing the external projection electrodes of the semiconductor device against the electrode pads on the tape circuit.

(8) A semiconductor device having a plurality of external projection electrodes on an underside of and a periphery of a semiconductor chip body in an area array fashion, the semiconductor device being tested by a burn-in testing, in which a socket for testing of semiconductor chips, including a tape circuit having electrode pads formed in an area array fashion, a mother socket supporting the tape circuit, and an elastomer sheet provided between the tape circuit and the mother socket and formed on a surface thereof with grooves, is used and the external projection electrodes of the semiconductor device are pushed against the electrode pads on the tape circuit.

(9) A method of manufacturing semiconductor devices having a plurality of external projection electrodes on an underside of and a periphery of a semiconductor chip body in an area array fashion, the method comprising the steps of using a socket for testing of semiconductor chips, which socket includes a tape circuit having electrode pads formed in an area array fashion, a mother socket supporting the tape circuit, and an elastomer sheet provided between the tape circuit and the mother socket and formed on a surface thereof with grooves, and performing a burn-in testing by pushing the external projection electrodes of the semiconductor device against the electrode pads on the tape circuit.

(10) Preferably, in the semiconductor device in (8), a spacing between the plurality of external projection electrodes on the semiconductor device is 0.5 mm or less.

With the use of the above described measures, it is possible to provide a socket construction for testing of ICs, which is of tape circuit type and is excellent in the capacity of accommodating dispersion in height between adjacent external projection electrodes on an IC being tested.

Since the elastomer sheet is formed with grooves or cuts, respective divided portions defined by the grooves or cuts on the elastomer sheet are made independent from one another to be capable of accommodating pushing forces from solder bumps.

Accordingly, even if the solder bumps, respectively, are varied in height, the respective portions defined by the grooves or cuts are hardly affected by one another, and accommodate pushing forces exerted by the solder bumps, thus enabling providing sure contact between the solder bumps and the electrode pads.

BRIEF DESCRIPTION OF THE DRAWINGS

FIG. 9 is a flowchart showing a method of manufacturing semiconductor devices, which are tested using a socket for testing of semiconductor chips.

DESCRIPTION OF THE PREFERRED EMBODIMENTS

Embodiments of the invention will be described hereinafter with reference to the accompanying drawings.

Figure 1:
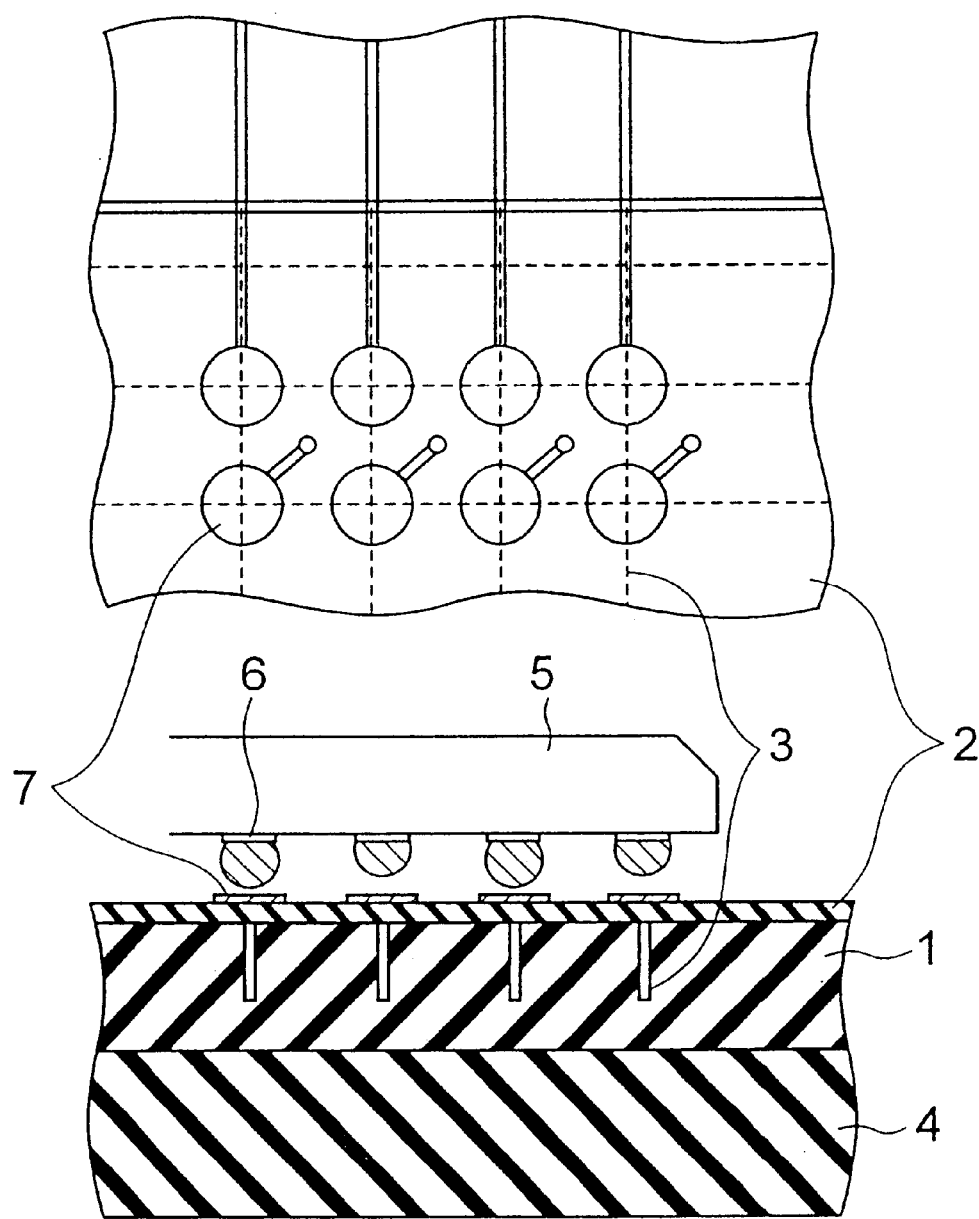
FIG. 1 is a view showing a socket for testing of semiconductor chips, according to a first embodiment of the invention in plan and in cross section.
Figure 2:
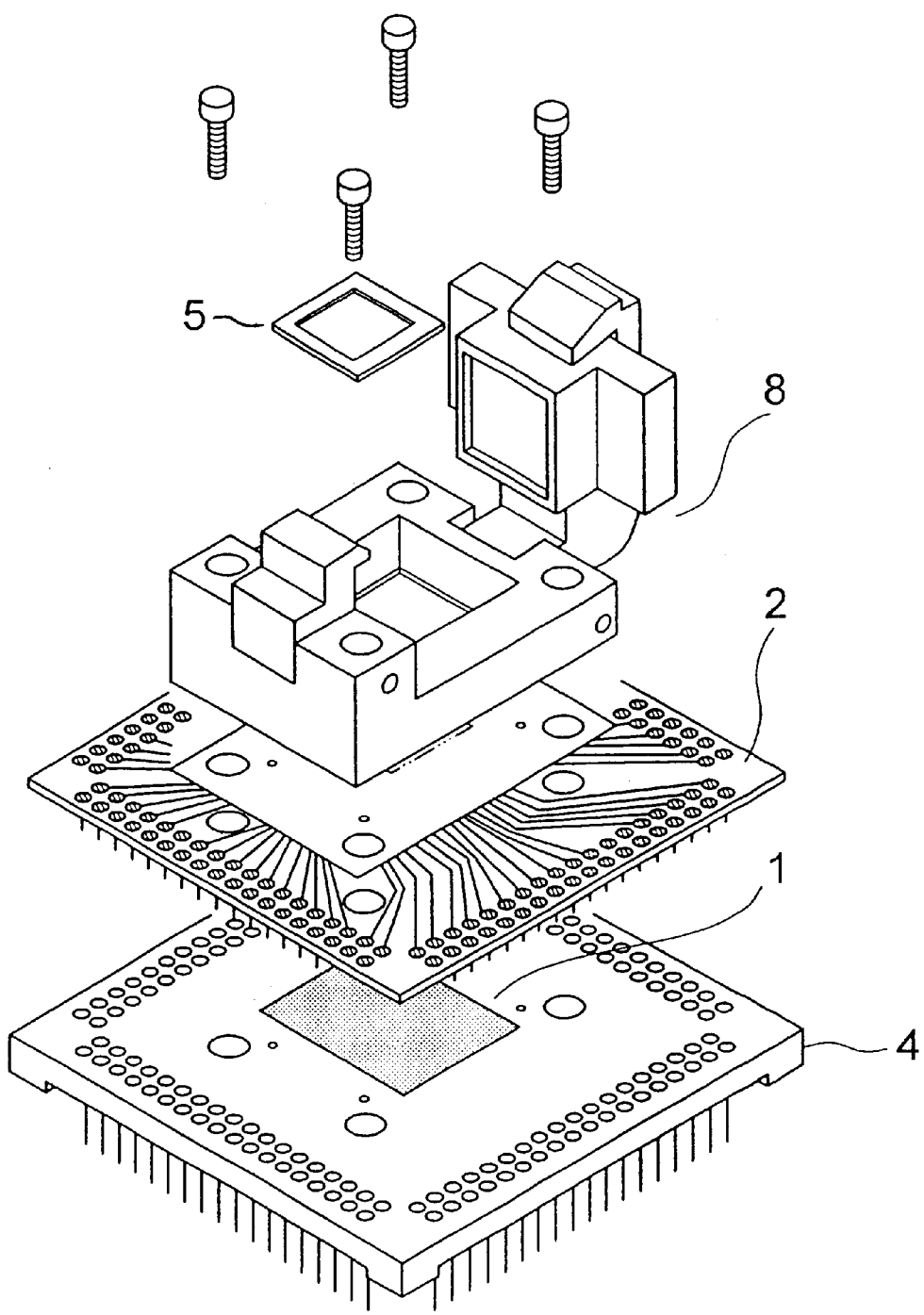
FIG. 2 is a perspective view showing an entire construction of a socket for testing of ICs, according to the invention.

FIG. 1 is a view showing in partially enlarged plan and cross section an IC insertion section of a socket for testing of ICs (socket for testing of semiconductor chips). Also, FIG. 2 is a view schematically showing a socket for testing of ICs, in which a tape circuit according to a first embodiment of the invention is used. In addition, a cross sectional portion of an IC socket body 8 is irrelevant directly to the invention, and so omitted from FIGS. 1 and 2.

In FIGS. 1 and 2, a tape circuit 2 is formed with electrode pads 7, which correspond to an arrangement of solder bumps 6 (arranged on an underside of and a periphery of a semiconductor chip body in an area array fashion) being external electrodes of an IC 5 being tested. The tape circuit 2 is made of a polyimide base material having an excellent heat-resistant property, and various regularities are formed on surfaces of the electrode pads 7 formed on the tape to stably maintain contact resistance between the surfaces and the solder bumps 6, which are external electrodes of the IC 5 being tested, to serve for rubbing off oxide films.

A wiring pattern including the electrode pads 7 on the tape circuit 2 is formed by means of the etching process or plating process, and electrolytic copper foil or rolled copper foil is used as a wiring material. As shown in FIG. 2, the tape circuit 2 is formed at its periphery with a plurality of pins.

Also, formed on a periphery of a mother socket 4 are a plurality of electric conductor portions positioned corresponding to the plurality of pins. And the tape circuit 2 is electrically connected to the mother socket 4 via the plurality of pins formed on the tape circuit 2. Also, an elastomer sheet (silicone rubber) 1 having an insulating property is provided between the mother socket 4 and a portion of the tape circuit 2, which is formed with the electrode pads 7 and on which the IC is mounted (inserted).

That side (facing the tape circuit 2) of the elastomer sheet 1, which contacts with the tape circuit 2, is formed with cut grooves 3, which are arranged in lattice pattern at at least the same pitch interval as that of the electrode pads 7 formed on the tape circuit 2. Accordingly, respective centers of the electrode pads 7 formed on the tape circuit 2 substantially coincide with intersection positions of the lattice-shaped cut grooves 3 (intersections of respective lattice lines defining the lattice are disposed to face the positions of the electrode pads formed on the tape circuit).

It is desired that the cut grooves 3 formed on the elastomer sheet 1 have a greater depth than a half of a total thickness of the elastomer sheet 1, and a less width than a diameter of the electrode pads 7 formed on the tape circuit 2. Also, the electrode pads 7 formed on the tape circuit 2 can be easily formed by means of a machine tool, which uses a razor-shaped blade, at low cost while they may be made by a metal mold, capable of forming lattice-shaped grooves only on one surface of the sheet, in a process of formation of the elastomer sheet 1.

Also, in view of the burn-in test, a material of the elastomer sheet 1 is desirably an insulating material based on silicone rubber and having an excellent heat-resistant property.

A testing method using the socket for testing of semiconductor chips, according to the first embodiment described above will be described below.

The IC 5 having a plurality of external electrodes (here, solder bumps 6) is inserted into the IC socket 8 to be positioned on the electrode pads 7 formed on the tape circuit 2 by a socket guide. And each of the plurality of solder bumps 6 is pushed by the external electrode IC socket body 8 to be brought into contact with the electrode pads 7 formed on the tape circuit 2. The plurality of electrode pads 7 formed on the tape circuit 2 are connected to the plurality of pins formed on the periphery of the tape circuit 2, and the plurality of pins are contacted with the plurality of electric conductor portions formed on the mother socket 4.

In this state, the IC 5 is placed under circumstances of 130° C. to 150° C., and a high temperature operation test is carried out by feeding actuating signals or the like to an internal circuit of the IC 5 from the mother socket 4 via the electrode pads 7 on the tape circuit 2 and the solder bumps 6.

And an IC 5, of which characteristics obtained in the above described high temperature operation test satisfy a predetermined characteristics, is selected as a good one.

In an actual test, a plurality of mother sockets 4 are mounted on a main board (not shown) to provide a one-unit testing board. And a plurality of sockets 8 for testing of ICs, tape circuits 2 and elastomer sheets 1 are arranged on the respective mother sockets 4, and a plurality of ICs 5 being tested are inserted into the plurality of sockets 8 for testing of ICs along guides of the sockets to be subjected to testing.

Here, since the above described elastomer sheet 1 is formed with the cut grooves 3 in lattice pattern and intersection positions of the cut grooves 3 substantially coincide with respective centers of the plurality of electrode pads 7, respective divided portions defined by the cut grooves 3 on the elastomer sheet 1 are made independent from one another to enable accommodating pushing forces exerted by the solder bumps 6.

Therefore, even if the respective solder bumps 6 involve dispersion in height, the respective divided portions defined by the cut grooves 3 are hardly influenced by one another, and so can accommodate pushing forces exerted by the solder bumps 6 to permit sure contact between the solder bumps 6 and the electrode pads 7.

Thus, according to the first embodiment of the invention, it is possible to accommodate dispersion in height between adjacent external projection electrodes on the IC and realize a socket for testing of semiconductor chips, which is capable of accurately testing semiconductor devices, which are made minute and high in density, and a method of testing semiconductor devices.

While the method of testing semiconductor devices with the use of contact pins has difficulty in testing when spacings between solder bumps are less than 0.75 mm, the testing apparatus and method according to the invention enable accurately testing semiconductor devices even when spacings between solder bumps are less than 0.75 mm.

Further, while the testing method by means of piercing contact pins into solder bumps generates traces caused by piercing the contact pins into the solder bumps, the testing apparatus and method according to the invention do not generate such traces caused by piercing pins into solder bumps.

While the above described first embodiment of the invention employs a constitution, in which one IC socket 8 corresponds to one IC 5, the tape circuit 2 is formed on a matrix to thereby enable to test ten and several IC 5 in a lump with one IC socket 8, in which case a similar effect can be obtained by forming the above described lattice-shaped cuts in the elastomer sheet disposed in those portions, on which the respective ICs are mounted (inserted).

Figure 3:
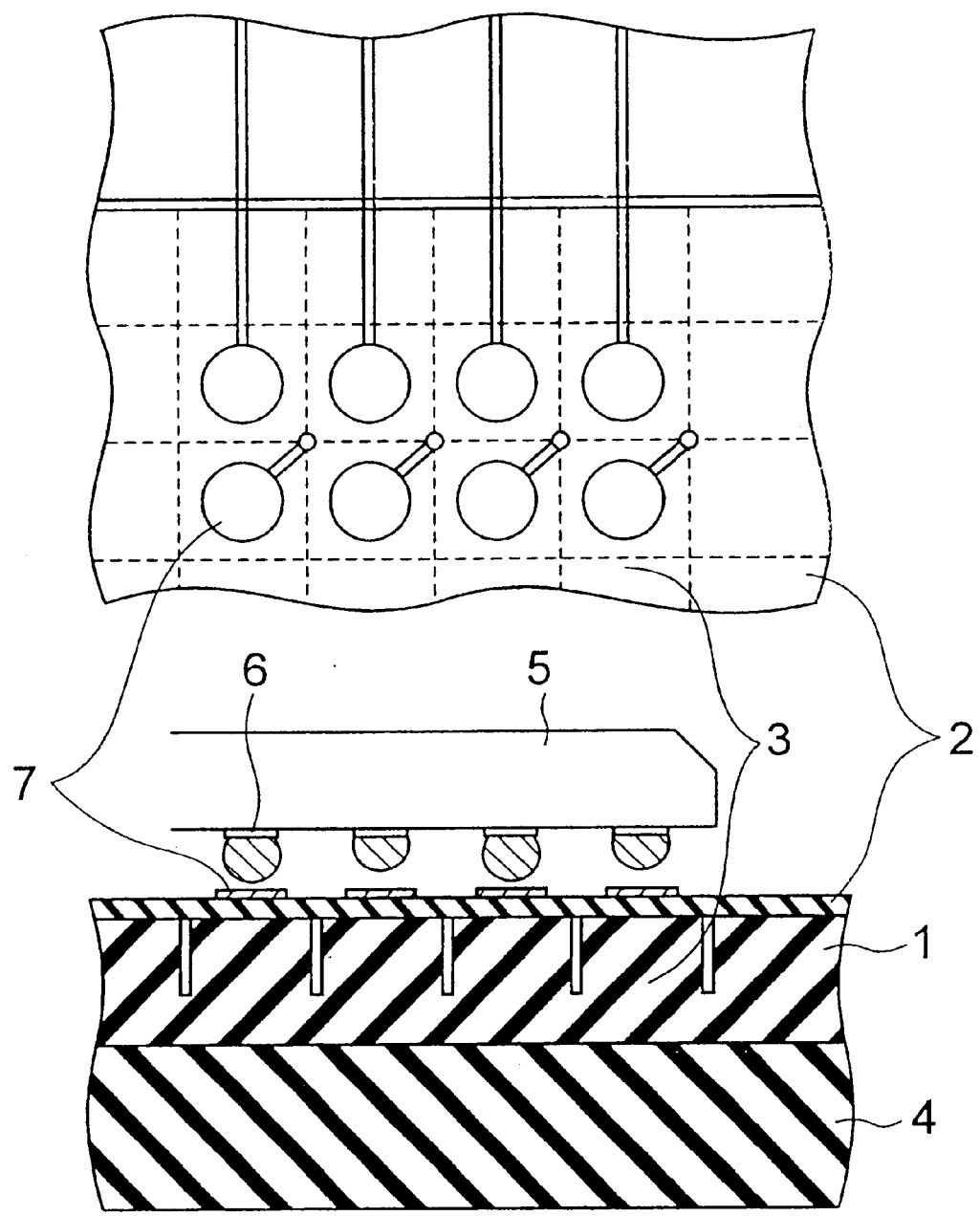
FIG. 3 is a view showing a socket for testing of semiconductor chips, according to a second embodiment of the invention in plan and in cross section.

FIG. 3 is a view showing a portion, as enlarged, of a socket for testing of ICs, according to a second embodiment of the invention in plan and in cross section. In addition, in the embodiment shown in FIG. 3, the same parts as shown in FIG. 1 are designated by the same reference numerals.

The second embodiment is generally identical in constitution to the first embodiment. With the second embodiment, however, the cut grooves 3 on the elastomer sheet 1 disposed between the mother socket 4 and a portion of the tape circuit 2, on which the IC is mounted (inserted), has a pitch offset by half a pitch with respect to the first embodiment and centers of the divided portions defined by the cut grooves 3 substantially coincide with respective centers of the plurality of electrode pads 7 (a spacing between respective lattice lines defining the lattice is substantially the same as a spacing between the electrode pads formed on the above described tape circuit).

Accordingly, independent islands (divided portions) on the elastomer sheet 1, respectively, are formed in respective positions of the electrode pads 7 formed on the tape circuit 2.

Because the remaining constitution of the second embodiment is identical to that of the first embodiment, it is omitted from the drawings and is not described in details.

As described above, according to the second embodiment, the elastomer sheet 1 is formed with the cut grooves 3 in lattice pattern and centers of the divided portions defined by the cut grooves 3 substantially coincide with respective centers of the plurality of electrode pads 7, whereby the respective portions defined by the cut grooves 3 on the elastomer sheet 1 are made independent from one another to enable accommodating pushing forces exerted by the solder bumps 6.

Therefore, even if the respective solder bumps 6 involve dispersion in height, the respective portions defined by the cut grooves 3 are hardly influenced by one another, and so can accommodate pushing forces exerted by the solder bumps 6 to permit sure contact between the solder bumps 6 and the electrode pads 7.

Thus, according to the second embodiment of the invention, it is possible as in the first embodiment to accommodate dispersion in height between adjacent external projection electrodes on the IC and to realize a socket for testing of semiconductor chips, which is capable of accurately testing semiconductor devices, which are made minute and high in density, and a method of testing semiconductor devices.

Figure 4:
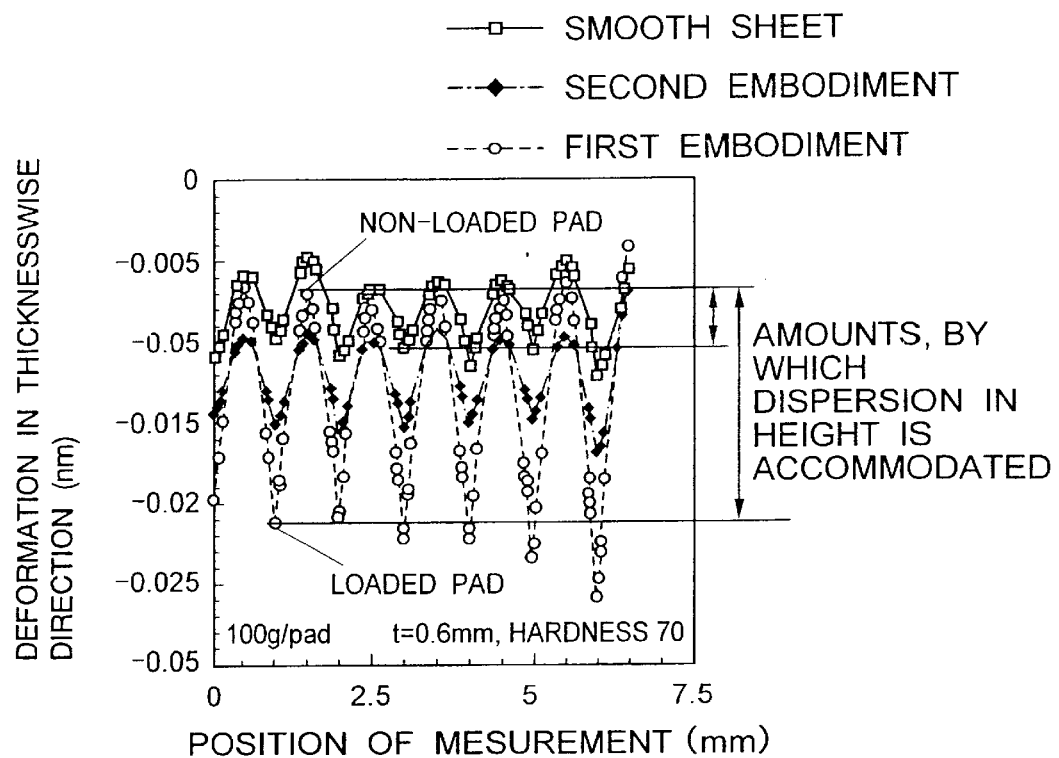
FIG. 4 is a graph showing results of analysis, in which effects of the invention are investigated.
Figure 5:
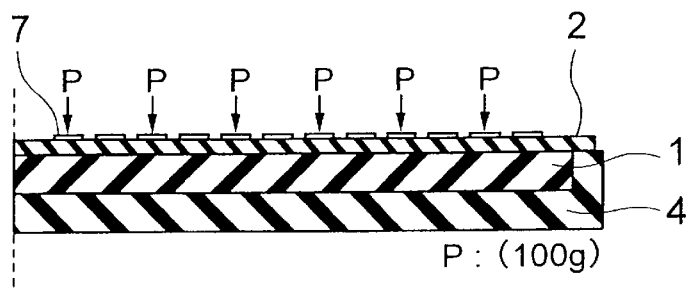
FIG. 5 is a view showing a cross sectional configuration and a load condition of an analytical model on the results of analysis shown in FIG. 4.

FIG. 4 is a graph showing results of comparison, through structure analysis, of amounts, by which dispersion in height between the solder bumps 6 are accommodated, in each of the case where the elastomer sheet 1 is a smooth sheet, the case of the first embodiment and the case of the second embodiment. To investigate amounts, by which dispersion in height between the solder bumps 6 is accommodated, a load P (100 g) was placed on the electrode pads 7 every other pad and differences in a heightwise direction between pads, on which the load P was placed, and non-loaded pads were calculated as shown in FIG. 5.

Analysis was carried out with the use of three-dimensional socket models and based on elastic analysis taking into account a geometrical non-linearity. In addition, an axis of ordinate in FIG. 4 indicates deformation (mm) in a thicknesswise direction and an axis of abscissa indicates a measured distance (mm) from a central point of the mother socket 4 toward corners thereof. And in the drawing, square marks shown by solid lines indicate a smooth sheet, circular marks shown by dashed lines indicate the first embodiment, and square marks shown by dashed lines indicate the second embodiment.

It is seen from the results shown in FIG. 4 that, in the case of the elastomer sheets 1 having the same thickness (t=0.6 mm) and the same hardness (70), the first embodiment can accommodate dispersion in height, about four to five times as that in the smooth sheet, and the second embodiment can accommodate dispersion in height, nearly two times as that in the smooth sheet.

Further, the first embodiment provides a construction, which is liable to deform upon application of point pressures (contact pressures exerted by the bumps) and hard to deform upon application of surface pressures (not contacted by the bumps), whereby amounts, by which dispersion in height is accommodated, is much enhanced. Also, the second embodiment permits the elastomer sheets 1 to deform independently of one another, so that amounts, by which dispersion in height is accommodated, is enhanced as compared with the smooth sheet.

Figure 6:
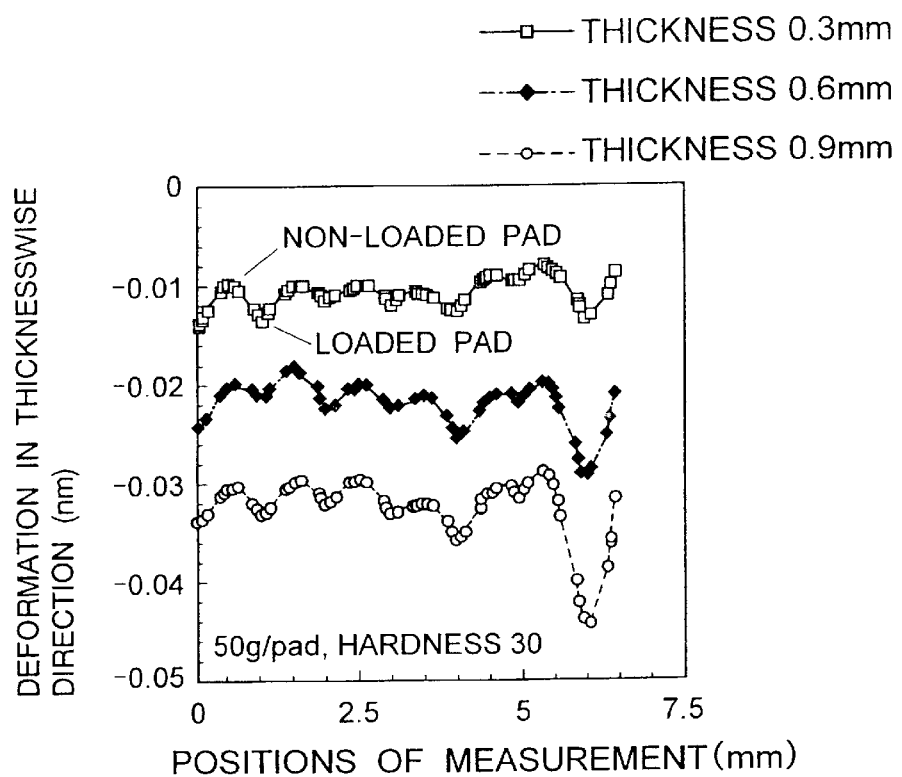
FIG. 6 is a graph showing results of analysis, in which influences of thickness of an elastomer sheet are investigated.
Figure 7:
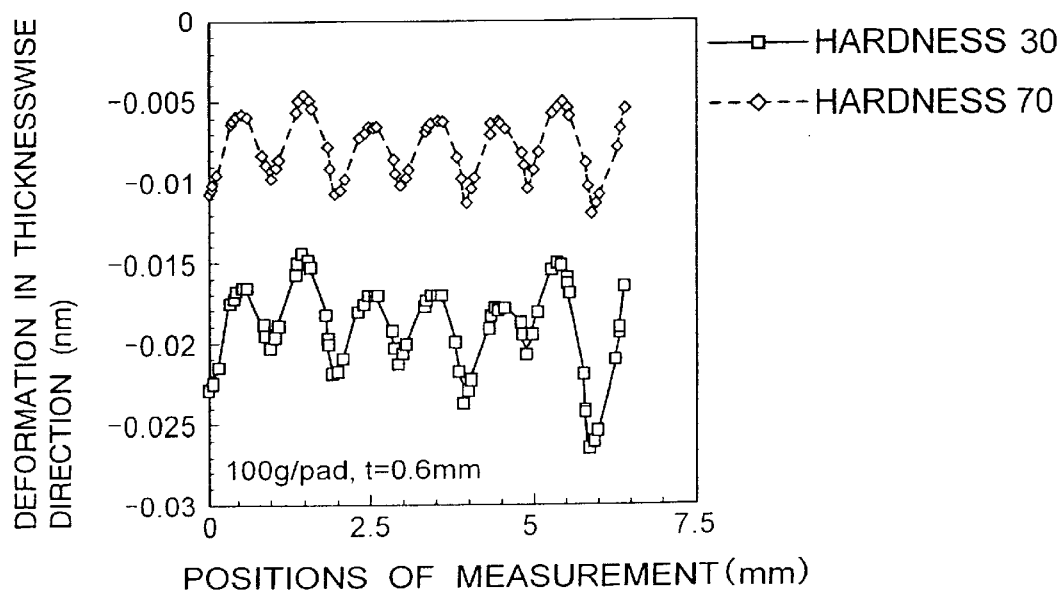
FIG. 7 is a graph showing results of analysis, in which influences of hardness of an elastomer sheet are investigated.

FIGS. 6 and 7 are graphs showing results of investigation on influences of thickness and hardness of elastomer sheets. FIG. 6 shows influences on amounts, by which dispersion in height between solder bumps is accommodated, when the elastomer sheet 1 was smooth, a load was 50 g/pad, a hardness of the sheet was 30, a thickness of the sheet was 0.3 mm, 0.6 mm and 0.9 mm, respectively. In the drawings, square marks shown by solid lines indicate a smooth sheet of 0.3 mm in thickness, square marks shown by dashed lines indicate a smooth sheet of 0.6 mm in thickness, and circular marks shown by dashed lines indicate a smooth sheet of 0.9 mm in thickness. The greater the thickness of the sheet, the greater macro deformation, but amounts, by which dispersion in height is accommodated, undergo a small change.

When the elastomer sheet is increased from 0.3 mm to 0.6 mm in thickness, amounts, by which dispersion in height is accommodated, are somewhat enhanced, but are not enhanced so much even when the elastomer sheet is increased up to 0.9 mm. This is because deformation of the elastomer sheet spreads in a out-of-plane direction when the elastomer sheet becomes great in thickness beyond a predetermined extent.

FIG. 7 shows influences on amounts, by which dispersion in height is accommodated, when a load was 100 g/pad, a thickness of the elastomer sheet was 0.6 mm, and a hardness of the elastomer sheet was varied. In FIG. 7, square marks shown by solid lines indicate the case, in which the hardness is 30, and square marks shown by dashed lines indicate the case, in which the hardness is 70.

Results shown in FIG. 7 reveal that the hardness has small influences on amounts, by which dispersion in height is accommodated. On the contrary, amounts of deformation in positions of the respective pads rather become constant when the elastomer sheet is made harder, and so it is advantageous to use rather hard elastomer sheets for the socket construction.

From the above described results of investigation, it is suitable that elastomer sheets have a thickness on the order of 0.3 to 0.6 mm, and there are not so much effects in the case of a thickness beyond that thickness, and it is desirable to select elastomer sheets having a little great hardness of 50° H or more in terms of the hardness of silicone rubber.

Figure 8:
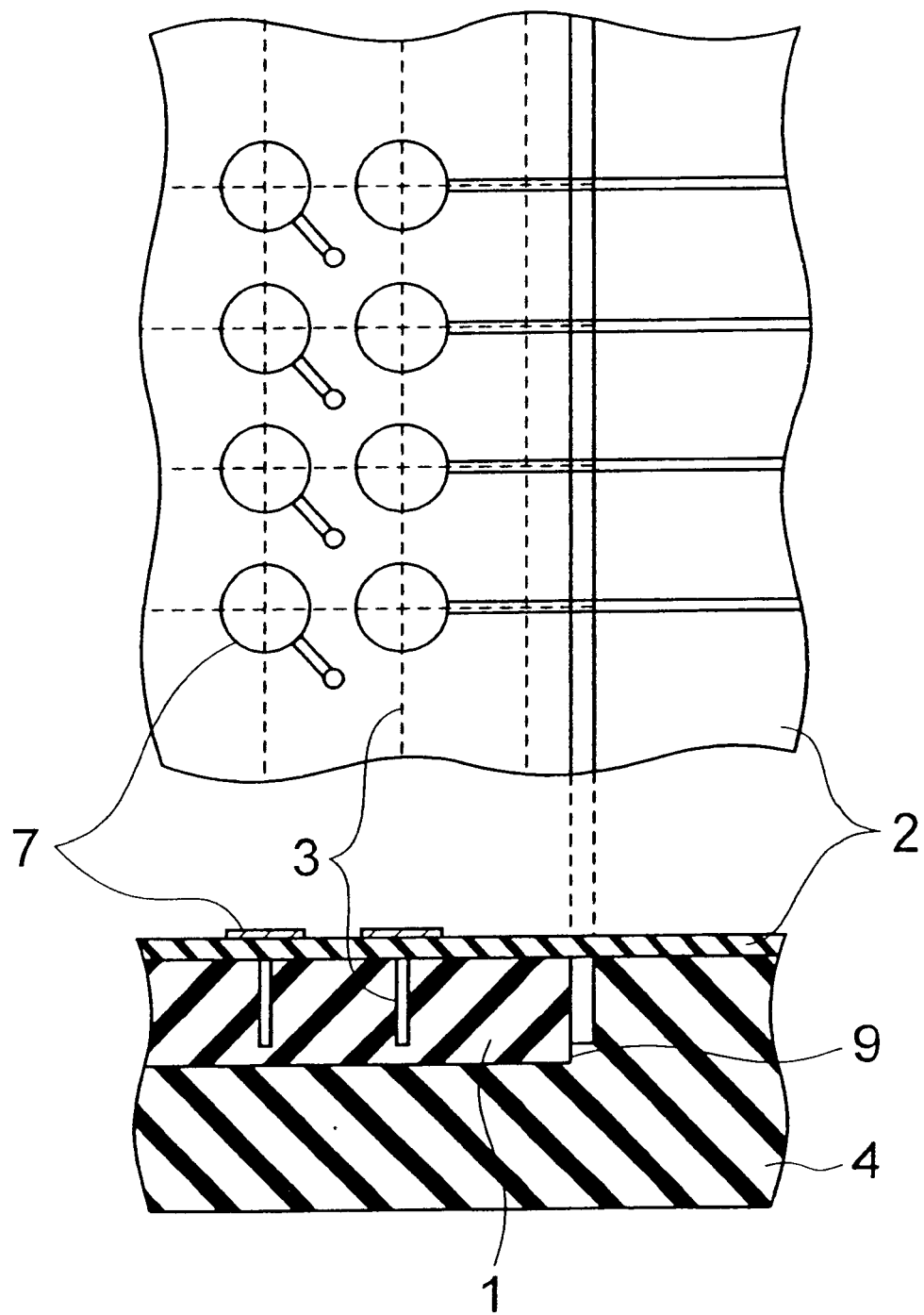
FIG. 8 is a view showing a socket for testing of semiconductors, according to a third embodiment of the invention in plan and in cross section.

FIG. 8 is a view showing a portion, as enlarged, of a socket for testing of ICs, according to a third embodiment of the invention in plan and in cross section. In the third embodiment, the mother socket 4 is formed with positioning stepped grooves 9 in order to position the elastomer sheet 1 on the tape circuit 2 with good accuracy.

An important factor in the invention resides in a positional relationship between the cut grooves 3 formed on the elastomer sheet 1 and the electrode pads 7 formed on the tape circuit 2. In the case where the entire elastomer sheet 1 is received as a whole in an elastomer sheet receiving portion of the mother socket 4, the elastomer sheet 1 is placed in hydrostatic pressure condition upon the application of pushing forces through the tape circuit 2, so that it becomes exceedingly great in practical rigidity.

Therefore, sufficiently shallow grooves relative to the thickness of the elastomer sheet 1 are formed in two stages on a groove portion, on which the elastomer sheet 1 is essentially installed, that is, side wall portions of an elastomer sheet receiving portion. Accordingly, gaps can be produced between the elastomer sheet 1 and side walls of the elastomer sheet receiving portion in the mother socket 4, whereby flexibility can be ensured on the elastomer sheet 1.

FIG. 9 is a flowchart showing a method of manufacturing semiconductor devices, which are tested with the use of a socket for testing of semiconductor chips and shipped.

In FIG. 9, product wafers manufactured in STEP S1 are subjected to initial selection for rejects by means of a P inspection (Pellet inspection) in STEP S2. And non-defective wafers as selected are made to proceed to STEP S3 or STEP S5. Whether the wafers should proceed to STEP S3 or STEP S5 is determined in terms of manufacturing installations or the like.

Dicing is performed on the product wafers in STEP S3, and only non-defective chips are individually packaged into CSP (Chip Size Packages) and BGA (Ball Grid Array) in STEP S4. And the chips are made to proceed to STEP S7.

Also, formation of a wiring pattern and a protective film and soldering of solder balls are performed in a lump on the wafers in STEP S5. Subsequently, the wafers, on which a wiring pattern or the like is formed, are individually divided by dicing. And the products are made to proceed to STEP S7.

In STEP S7, the method of testing semiconductor devices with the use of the socket for testing of semiconductor chips, according to the first, second and third embodiments of the invention is executed. More specifically, the products having a final configuration and individually divided are subjected to final selection in the burn-in test by the socket for testing of semiconductor chips, according to the invention. And those among the products, which are judged to be non-defective, are shipped in STEP S8.

According to the invention, it is possible to realize a method of manufacturing reliable semiconductor devices, which method is capable of accommodating dispersion in height between adjacent external projection electrodes on an IC and accurately testing semiconductor devices, which are made minute and high in density, and reliable semiconductor devices manufactured by the manufacturing method.

Also, it is possible according to the invention to manufacture semiconductor devices free from traces caused by piercing pins into solder bumps.

In addition, with the arrangement, the cut grooves 3 are formed on the elastomer sheet 1 while cuts rather than the cut grooves may be simply formed on the sheet. Also, the elastomer sheet 1 can be a plurality of divided portions, which are completely divided.

It is possible to realize a socket for testing of semiconductor chips, which is capable of accommodating dispersion in height between adjacent external projection electrodes on an IC and accurately testing semiconductor devices, which are made minute and high in density, a method of testing semiconductor devices, a method of manufacturing semiconductor devices with the use of the testing method, and semiconductor devices manufactured by the manufacturing method.

Also, the invention enables testing with a further small load.

What is claimed is:

1. A socket for testing of semiconductor chips having a plurality of external projection electrodes arranged on an underside and a periphery of a semiconductor chip body in an area array fashion, the socket comprising a tape circuit having electrode pads formed in an area array fashion, a mother socket supporting the tape circuit, and an elastomer sheet provided between the tape circuit and the mother socket, the elastomer sheet being formed on a main surface thereof, facing said tape circuit, with grooves at least located to extend lengthwise along the main surface of the elastomer sheet to bridge between adjacent electrode pads both located on said tape circuit above said main surface.

2. The socket for testing of semiconductor chips, according to claim 1, wherein the main surface of the elastomer sheet is divided into a lattice by said grooves to have a plurality of regions in said main surface, which regions are each completely surrounded by said grooves, and a spacing between respective grooves defining the lattice is substantially the same as a spacing between the electrode pads formed on the tape circuit.

3. The socket for testing of semiconductor chips, according to claim 1, wherein the elastomer sheet is an insulating sheet having a hardness of 50° H or more.

4. A method of testing semiconductor chips having a plurality of external projection electrodes on an underside and a periphery of a semiconductor chip body in an area array fashion, the method comprising a burn-in testing step of using a socket for testing of semiconductor chips through electrical connection between the semiconductor chips and the socket, which socket includes a tape circuit having electrode pads formed in an area array fashion, a mother socket supporting the tape circuit, and an elastomer sheet provided between the tape circuit and the mother socket and formed on a main surface thereof, facing said tape circuit, with grooves at least located to extend lengthwise along the main surface of the elastomer sheet to bridge between adjacent electrode pads both located on said tape circuit above said main surface, and performing testing by pushing the external projection electrodes of the semiconductor chips against the electrode pads on the tape circuit.

5. A system for testing semiconductor chips having a plurality of external projection electrodes on an underside and a periphery of a semiconductor chip body in an area array fashion, the semiconductor chips being tested by burn-in testing, the system comprising a socket for testing of semiconductor chips, including a tape circuit having electrode pads formed in an area array fashion, a mother socket supporting the tape circuit, and an elastomer sheet provided between the tape circuit and the mother socket and formed on a main surface thereof, facing the tape circuit, with grooves at least located to extend lengthwise along the main surface of the elastomer sheet to bridge between adjacent electrode pads both located on said tape circuit above said main surface, wherein burn-in testing is accomplished by pushing the external projection electrodes of the semiconductor chips against the electrode pads on the tape circuit to provide electrical connection between the semiconductor chips and the socket.

6. The system according to claim 5, wherein a spacing between adjacent external projection electrodes on the semiconductor chips is 0.5 mm or less.

7. A socket for testing of a semiconductor chip having a plurality of external projection electrodes, comprising:

a mother socket;

an elastomer sheet located on said mother socket; and electrode pads located on said elastomer sheet so as to contact said external projection electrodes;

wherein said elastomer sheet has divided surface portions forming a groove lattice comprised of a plurality of grooves in a main surface of said elastomer sheet such that said grooves extend lengthwise along the main surface of the elastomer sheet to bridge between adjacent ones of said electrode pads both located on said main surface.

8. The socket for testing of a semiconductor chip having a plurality of external projection electrodes according to claim 7, further comprising an IC socket body to hold said semiconductor chip in contact with said electrode pads.

9. The socket for testing of a semiconductor chip having a plurality of external projection electrodes according to claim 8, wherein a plurality semiconductor chips are held in said IC socket body.

10. The socket for testing of a semiconductor chip having a plurality of external projection electrodes according to claim 7, wherein said elastomer sheet is formed on said mother socket, and a positioning step groove is located between an end of said elastomer sheet and a corresponding end portion of said mother socket.

11. A socket for testing of chips having a plurality of external projection electrodes on an underside and a periphery of a semiconductor chip body in an area array fashion, a socket comprising means for accommodating differences in height between the plurality of external projection electrodes, said means comprising a tape circuit having electrode pads formed in an area array fashion, a mother socket, and an elastomer sheet provided between the tape circuit and the mother socket, the elastomer sheet having grooves formed in a main surface thereof, facing said tape circuit, with grooves at least located to extend longitudinally along the main surface of the elastomer sheet between adjacent electrode pads both located on said tape circuit above said main surface.

\* \* \* \* \*